United States Patent
Hellmann et al.

[11] Patent Number: 6,150,006
[45] Date of Patent: Nov. 21, 2000

[54] QUARTZ GLASS COMPONENT USED IN THE PRODUCTION OF SEMICONDUCTORS

[75] Inventors: Dietmar Hellmann, Linsengericht, Germany; Gerard Lebrun, Coublevie, France; Jörg Becker, Niddatal, Germany

[73] Assignee: Heraeus Quarzglas GmbH & Co. KG, Hanau, Germany

[21] Appl. No.: 09/194,307

[22] PCT Filed: Mar. 24, 1998

[86] PCT No.: PCT/EP98/01715

§ 371 Date: Nov. 24, 1998

§ 102(e) Date: Nov. 24, 1998

[87] PCT Pub. No.: WO98/44538

PCT Pub. Date: Oct. 8, 1998

[30] Foreign Application Priority Data

Mar. 27, 1997 [DE] Germany ............ 197 13 014

[51] Int. Cl.[7] .......... C23C 14/56; C23C 16/44; C23C 16/02
[52] U.S. Cl. .......... 428/141; 428/694 SG; 156/345; 118/728
[58] Field of Search .......... 428/141, 65.3, 428/694 SG; 438/689, 692; 65/31, 61; 216/80, 99; 118/715, 728; 364/474.08; 427/554; 156/345

[56] References Cited

U.S. PATENT DOCUMENTS

| | | | |
|---|---|---|---|
| 4,797,316 | 1/1989 | Hecq et al. ............ | 428/167 |
| 5,562,774 | 10/1996 | Breidenbach et al. ............ | 118/715 |
| 5,614,071 | 3/1997 | Mahvan et al. ............ | 204/298.11 |
| 5,807,416 | 9/1998 | Kemmochi et al. ............ | 65/32.4 |

FOREIGN PATENT DOCUMENTS 0 763 504 A1  3/1997  European Pat. Off. .

OTHER PUBLICATIONS

Derwent record for JP 10 167760.
Derwent record for JP 4–15215.
Patent Abstracts of Japan, vol. 16, No. 435 (E–1263) for JP 04 152515 A May 26, 1992.
Patent Abstracts of Japan, vol. 004, No. 185 (E–038) for JP 55 127021 A, Oct. 1, 1980.
Patent Abstracts of Japan, vol. 008, No. 049 (E–230) for JP 58 202535 A.

Primary Examiner—Ellis Robinson
Assistant Examiner—Laura L. Lee
Attorney, Agent, or Firm—Andrew L. Tiajoloff

[57] ABSTRACT

A quartz glass component for use in the manufacture of semiconductors is provided. It has a rough surface which is formed by irregular elevated structural elements which extend between a first, higher plane and a second, lower plane. A plurality of the structural elements has a substantially flat top surface extending in the first plane. This surface is bounded on all sides by facet-like, substantially flat, side surfaces which extend between the first and the second planes. The average surface roughness depth $R_a$ lies between 0.1 μm and 10 μm and the size of the structural elements ranges on average between 30 μm and 180 μm. The invention provides a quartz glass component particularly suitable for the adhesion of CVD layers and having a long service life.

10 Claims, 3 Drawing Sheets

QUARTZ GLASS COMPONENT USED IN THE PRODUCTION OF SEMICONDUCTORS

FIELD OF THE INVENTION

The invention relates to a component made of quartz glass, for use in the manufacture of semiconductors, with a rough surface which is formed by irregular, raised structural elements extending between a first, higher plane and a second, lower plane, whereby a plurality of the said structural elements has a substantially flat top surface extending in the first plane, the said top surface being bounded on all sides in a facet-like manner by substantially flat side surfaces which extend between the first and the second planes.

DISCUSSION OF PRIOR ART

The coating of substrates using so-called CVD processes is common in the manufacture of semiconductor components. As an example, layers of silicon oxide, silicon nitrate or silicon are deposited on silicon wafers. During this process the coating materials form deposits not only on the substrates but also on the walls of the processing chamber and on the apparatus arranged therein. Upon reaching a certain thickness these coats break off and thus cause particle problems. In order to avoid this the affected surfaces are cleaned from time to time.

The cleaning of the surfaces is costly in terms of time and money. In order to reduce these costs it is desirable to keep the time periods between consecutive cleaning steps as long as possible. However, especially during the CVD processes at higher temperatures, the difference between the thermal expansion coefficient of quartz glass and of the coating material leads to separation of the coats even at relatively small coat thicknesses.

It is known that roughened surfaces can hold thicker CVD layers. Sandblasting or chemical etching processes are commonly used to roughen quartz glass components. Even though sandblasting produces structures on the quartz glass surface which on the one hand contribute to a stronger bond of CVD layers, on the other hand this induces fractures in the component surface which in turn leads to separation of the CVD layers. Moreover, with sandblasting, a homogenous treatment of the entire surface of the component and maintenance of exact dimensioning is problematic.

As an alternative, the quartz glass component surfaces are roughened by chemical etching solutions. Etching of the surface frequently creates rounded surface structures, for example small round or oval grooves. In comparison with surfaces treated by sandblasting, such surfaces present reduced adhesiveness to CVD coats.

The published Japanese patent application No. JP 6-332956 describes a component of the kind indicated above. This document discloses an etching solution for the roughening of quartz glass surfaces which makes it possible to produce irregular, raised, substantially sharp-edged structural elements on a quartz glass component surface. When viewed from above, a granular morphology of a surface treated with the known acid solution is visible, with adjoining structural elements having mesa or truncated pyramid shapes. The structural elements extend between a higher level, for example the original surface of the component, and a lower level which is defined by for example the maximum etching depth. The dimensions of the structural elements have an average size from 5 mm to 15 mm. It is true that microfractures are not discernible in the quartz glass surface. But it has been shown that a surface so formed is not suitable for adherence of thick CVD layers.

SUMMARY OF THE INVENTION

The object of the present invention is to provide a component made of quartz glass with a rough surface which is particularly suitable for adhesion of CVD coats.

According to the invention this object is accomplished on the basis of the above-described quartz glass component in that the average depth of surface roughness $R_a$ is between 0.1 $\mu$m and 10 $\mu$m and the magnitude of projection of the structural elements to the first plane has an average value between 30 $\mu$m and 180 $\mu$m.

It has been shown that the average roughness of the surface and especially the average size of the structural elements is decisive for a firm adhesion of the CVD layers. Optimal results are obtained when the average roughness depth $R_a$ ranges between 0.1 $\mu$m and 10 $\mu$m. The roughness depth $R_a$ is determined according to DIN 4768.

It is of substance that beside an average surface roughness depth being in the range indicated above, the size of the structural element projection to the first, upper plane have an average value between 30 $\mu$m and 180 $\mu$m. The size of the structural elements is determined by viewing the surface from above. In a view from above it can be seen that the structural elements, separated from each other only by the boundary lines, are immediately adjoining one another. The boundary lines are easily recognizable due to the elevated nature of the structural elements. The greatest distance between two opposite boundary lines is considered to be the size of the structural elements. A 10 mm$^2$ area of the component surface will be used for evaluation. The average size shall be the mathematic average of the dimensions measured. Structural elements of less than 5 $\mu$m are not taken into account when determining the average size.

A quartz glass component with such surface microstructure is distinguished by an excellent adhesion of CVD coats, especially of layers that are deposited in a process at higher temperatures. This effect can be explained by the special type of surface roughness which contributes to a favorable tension distribution between the quartz glass and the CVD layer material. The surface microstructure results in a three-dimensional distribution of tension. For this it is necessary that the structural elements be composed of substantially flat surface elements in facet-like manner and that they exhibit an average size which does not exceed 180 $\mu$m. This results in a density and distribution of the structural elements and the top and side surfaces which form them that makes a suitable distribution of tension possible. This effect is no longer observable if the average size of the structural elements is below 30 $\mu$m.

In the sense of the invention, a flat surface is also understood to mean an arched top surface such as would be created for example after etching on the non-etched areas of the outer cylinder surface of a tubular or rod shaped quartz glass component. When the structural elements are created by etching, the upper plane may be defined by the upper surface of non-etched areas or by the surface where etching removed the least material. Advantageously, the average depth of roughness $R_a$ of the surface is between 1 $\mu$m and 5 $\mu$m and the projection of the structural elements to the first plane has an average size ranging between 50 $\mu$m and 100 $\mu$m.

An especially well proven component has been shown to be one where at least a part of the side surfaces comprises step element formations. A step element is created when side surfaces are arranged adjoining and in pairs, of which the one side surface is parallel or at a small angle in relation to the top surface and the adjoining side surface extends at a greater angle relative to the top surface. It is not necessary to maintain a right angle between adjoining side surfaces. A stepwise construction of the side boundary surface of the structural elements results from sequential arrangement of a plurality of step elements. Such step construction of side boundary surfaces additionally contributes to a tension reduction through three-dimensional distribution of tension. The effect is already detectable when such step-wise formation and arrangement of the side surfaces is present in some of the structural elements. It is not necessary for all step elements to have the same geometric dimensions of the side boundary wall. An especially distinct effect of the adhesiveness of CVD coats is exhibited by step elements with a step depth ranging between 0.5 µm and 5 µm.

A preferred embodiment of the quartz glass component is one where a groove with a width of at least 1 µm is formed in the second plane between adjoining structural elements. Such grooves, formed between the elevations of adjoining structural elements, have been shown to be especially advantageous for a firm adhesion of CVD coats. What is meant by the width here is the average width of the groove over the distance the groove separates two adjoining structural elements. The floor surface of the groove may be flat or arched.

Especially well proven has been a quartz component with structural elements having sharp edges or corners. Such edges or corners have for example an undercut where the CVD coat adhering to the component can engage.

BRIEF DESCRIPTION OF THE FIGURES

The invention is explained below in more detail by way of examples and the drawing. The drawing shows in particular, in FIG. 1, a schematic representation of the cross section of a component according to the invention, in a view perpendicular to the surface.

DETAILED DESCRIPTION

Figure 1:
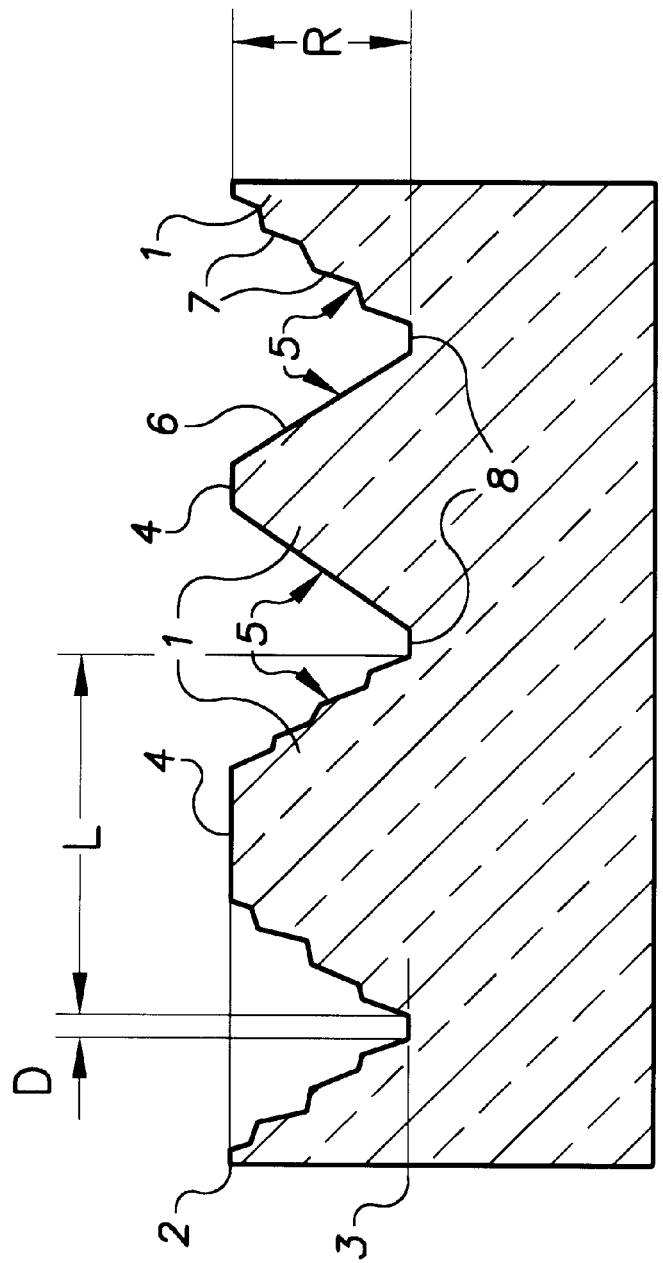

FIG. 1 schematically shows the structural elements in the sense of the invention, as elevations 1. The elevations 1 extend between a first, upper plane 2 and a second, lower plane 3. In cross section the elevations 1 have the shape of a truncated cone. They have a flat top surface 4 which extends within the upper plane 2. The top surface 4 is bounded by side walls which are collectively designated as reference 5 in FIG. 1. The side walls 5 are partially formed as smooth boundary surfaces 6 or are composed of individual step elements 7 in form of steps. The individual step elements 7 differ in shape from each other. The side walls 5 of adjoining elevations 1 do not immediately adjoin, instead, a groove 8 with a flat floor extends in each instance between them. The floor of the grooves 8 defines the lower plane 3. The adjoining elevations 1 are separated by the groove 8.

The dimension defining the size of elevation 1 is marked L in FIG. 1. The average groove width is established by the measurement D. The distance R is measured at several locations between the upper plane 2 and the lower plane 3 in order to establish the surface roughness, and the average value $R_a$ is calculated therefrom according to DIN 4768.

Figure 2:
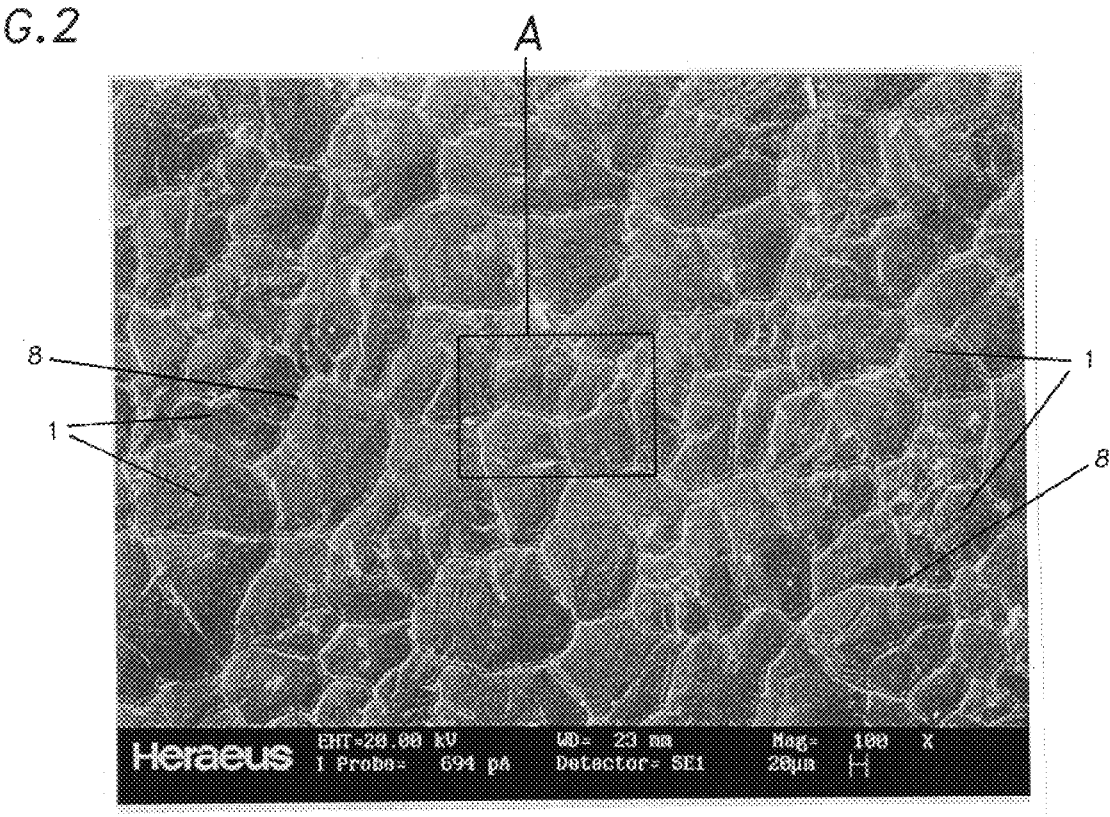
in FIG. 2, a scanning electron microscope image of the surface of the component according to the invention, magnified 100×, and in FIG. 3, a 500× magnification of the area marked A in FIG. 2.

The scanning electron microscope image in FIG. 2 shows that the surface of a quartz glass component according to the invention is defined by a plurality of irregular elevations 1 which are distinguished by sharp edges and corners, and which are separated by the grooves 8. The elevations 1 appear as dark spots in the image and the grooves 8 as bright boundary lines. In this concrete exemplary embodiment the average size of the elevations 1 is about 100 µm. The $R_a$ value of the surface shown in FIG. 2 is about 2 µm.

Figure 3:
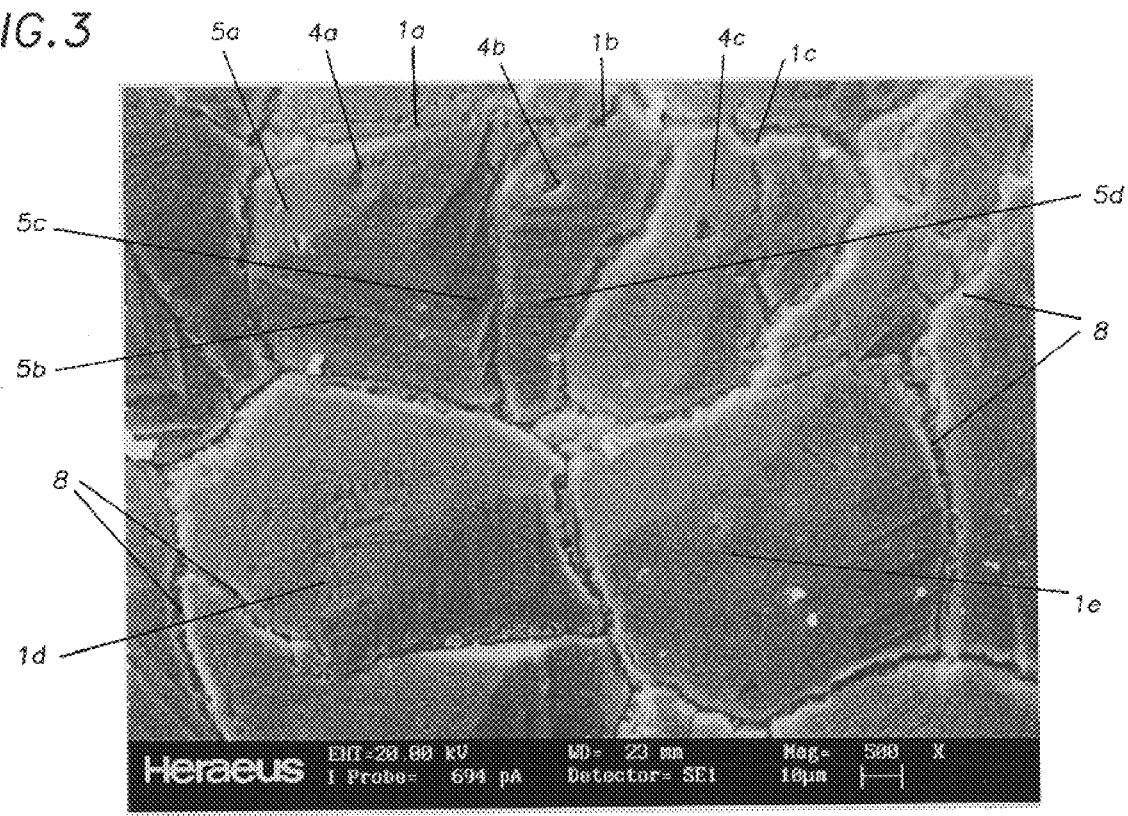

A magnification of the area A is shown in FIG. 3. In it can be seen surface microstructure details of the quartz glass component according to the invention and they are explained below in more detail.

The image shows substantially five irregular elevations shaped like truncated pyramids and marked with reference numbers 1a to 1e. For example, elevation 1a shows a distinct top surface 4a in the shape of a polygon which is bounded by downward sloping side walls 5a, 5b and 5c. The side walls 5a, 5b, 5c are formed in steps. The stepwise formation is seen particularly well in wall 5d. The depths of the individual steps in side wall 5d are not uniform; in the middle the depth is about 1 µm. The height of the individual steps also varies.

The individual elevations 1a to 1e are separated by grooves 8. The grooves 8 have an average width D of about 2 µm. Their floor surface is in the example not flat but irregular due to a plurality of adjoining small grooves with diameters of less than 1 µm.

The microstructure of the component surface shown presents a plurality of places of adhesion to the CVD coat being deposited thereon. This is assured on the one hand by the average surface roughness indicated above which is substantially determined by the heights R of each elevation, and on the other hand by the lateral dimensions L. The density and distribution of the elevations is also reflected in the average surface roughness $R_a$.

Compared to the component known from prior art, during a CVD process at temperatures around 600° C., silicon coats five to ten times thicker could be deposited on the quartz component according to the invention, without any separation of the layers being observed. The life of the component according to the invention is correspondingly longer.

A method for the manufacture of the component according to the invention is explained below.

A flame polished quartz glass tray for holding silicon semiconductor disks is cleaned in alcohol solution and in an etching solution containing hydrofluoric acid. A clean and homogenous surface contributes to the creation of uniform roughness and the above-described fine-grained microstructure extending over the entire surface of the component.

An etching solution is prepared according to the following composition.
HF (added as a 50% solution), 23.6% by weight, ammonium fluoride (added as a solid), 17.4% by weight, acetic acid (added as 100% pure acetic acid), 35.4% by weight, and water, 23.6% by weight.

The etching solution is left to stand for one hour to stabilize. The stabilizing also contributes to the creation of uniform roughness and of the above-described fine-grained microstructure over the entire component surface.

The tray is brought to a temperature of about 15° C. The quartz glass tray is immersed into the etching solution. To achieve an acid attack as even as possible and to prevent deposits on the tray surface the immersion takes place as quickly as possible.

The treatment lasts 60 min. at a etching solution temperature of 15° C. The tray is subsequently cleaned for 10 min. in a 5% hydrofluoric acid solution. After the etching and cleaning process the surface exhibits a microstructure shown in FIGS. 2 and 3, with an average roughness of 2 μm.

Tray and solution can also be brought to a different temperature, for example about 20° C. The composition of the solution may be adjusted as the case may be. At higher temperatures, greater dilution of etching solutions is appropriate.

A further method for the production of a suitable etching solution and an example for the manufacture of a component according to the invention are indicated below.

First, an aqueous ammonia fluoride solution is prepared in a coolable container by mixing into pure water ammonia fluoride powder at a ratio of 40% by weight. By adding hydrofluoric acid at 50% by weight, an aqueous basic etching solution is prepared, which has an HF proportion of 13% by weight and a $NH_4F$ proportion of 30% by weight. The actual etching solution is prepared only shortly before the etching process, by adding 60 parts by volume of an additive solution to 40 parts by volume of the base solution. The additive solution contains acetic acid which is 99.7% pure and has a boiling point of 118.1° C. A quartz glass tube is treated for 3 hours in a solution thus prepared and is subsequently washed in pure water and dried. The quartz glass tube then has a surface roughened in a facet like fashion where the average roughness depth $R_a$ is 0.6 μm and the average size of the individual facets is about 100 μm.

What is claimed is:

1. A quartz glass article for use in the manufacture of semiconductors, said article comprising:

a quartz glass component having a component surface defined by a plurality of irregular, elevated structural elements each having an upwardly disposed substantially flat top surface extending in a first plane;

said structural elements having side surfaces adjacent to the top surface which extend outwardly and downwardly therefrom and from the first plane;

the component surface having an average roughness depth $R_a$ in a range of 0.1 μm to 10 μm;

the structural elements having an average size between 30 μm and 180 μm;

at least a part of the side surfaces including a formation of step elements; and adjoining structural elements defining therebetween grooves with a width of at least 1 μm.

2. The invention according to claim 1, wherein the average roughness depth $R_a$ of the surface is between 1 μm and 5 μm and the average size of the structural elements is between 50 μm and 100 μm.

3. The invention according to claim 2, wherein the step elements have a step depth in the range from 0.5 μm to 5 μm.

4. The invention according to claim 1, wherein the side surfaces each have a substantially planar portion adjacent the top surface.

5. The invention according to claim 2, wherein the grooves are formed by serially forming a plurality of smaller grooves.

6. The invention according to claim 1, wherein the structural elements are formed with corners or edges where the top surface meets the side surface.

7. An article for use in production of semiconductors, said article comprising:

a quartz glass component having a surface structure comprising structural elements;

said structural elements each projecting upwardly of the component and each having an upper portion providing a substantially flat top surface in a first plane;

the surface structure including upwardly disposed floor portions between adjacent structural elements, said floor portion being substantially flat and generally parallel to the first plane;

said top surface having a peripheral boundary edge, and said structural elements further having side portions extending obliquely downward into the component and outward from the boundary edge of the top surface to the adjacent floor portion;

the side portions having a side surface which is flat or segmented into one or more step formations;

the side portions of the structural elements and the floor portions of the component surface defining grooves in the component between the structural elements;

said surface structure having an average roughness depth between 0.1 μm and 10 μm;

the structural elements having an average maximum dimension, the maximum dimension for each structural element being measured as the maximum distance for each structural element between points where the side portions meet the floor portions, said average dimensions being in the range of 30 to 180 μm;

at least one of said side portions being segmented into one or more step formations, said step formations having steps with a depth of 0.5 to 5 μm; and said floor portions in said grooves being at least 1 μm in size between the adjacent structural elements.

8. The invention according to claim 7 wherein the grooves are formed by serially removing material for the component so as to incrementally increase the depth of the grooves.

9. The invention according to claim 7, wherein the average roughness depth is 1 to 5 μm.

10. The invention according to claim 7 wherein the average maximum dimension of the structural elements is between 50 and 100 μm.

* * * * *